(12) United States Patent
Radosavljevic et al.

(10) Patent No.: US 10,211,327 B2
(45) Date of Patent: Feb. 19, 2019

(54) SEMICONDUCTOR DEVICES WITH RAISED DOPED CRYSTALLINE STRUCTURES

(71) Applicant: Intel Corporation, Santa Clara, CA (US)

(72) Inventors: Marko Radosavljevic, Beaverton, OR (US); Sansaptak Dasgupta, Hillsboro, OR (US); Sanaz K. Gardner, Portland, OR (US); Seung Hoon Sung, Portland, OR (US); Han Wui Then, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/567,579

(22) PCT Filed: May 19, 2015

(86) PCT No.: PCT/US2015/031542
§ 371 (c)(1),
(2) Date: Oct. 18, 2017

(87) PCT Pub. No.: WO2016/186654
PCT Pub. Date: Nov. 24, 2016

(65) Prior Publication Data
US 2018/0190807 A1    Jul. 5, 2018

(51) Int. Cl.
*H01L 29/778*    (2006.01)
*H01L 29/66*    (2006.01)
(Continued)

(52) U.S. Cl.
CPC ...... *H01L 29/7786* (2013.01); *H01L 21/0254* (2013.01); *H01L 21/02381* (2013.01);
(Continued)

(58) Field of Classification Search
CPC .............. H01L 29/778; H01L 29/0891; H01L 29/2003; H01L 29/7786; H01L 21/02381; H01L 21/02513
See application file for complete search history.

(56) References Cited

U.S. PATENT DOCUMENTS

| | | |
|---|---|---|
| 7,952,150 B1 | 5/2011 | Wohlmuth |
| 8,173,551 B2 | 5/2012 | Bai et al. |

(Continued)

FOREIGN PATENT DOCUMENTS

| | | |
|---|---|---|
| EP | 1054442 | 11/2000 |
| JP | 2001230410 | 8/2001 |

(Continued)

OTHER PUBLICATIONS

Extended European Search Report for European Patent Application No. 14902161.0, dated Mar. 22, 2018.

(Continued)

*Primary Examiner* — Phuc Dang
(74) *Attorney, Agent, or Firm* — Green, Howard & Mughal LLP

(57) ABSTRACT

Semiconductor devices including an elevated or raised doped crystalline structure extending from a device layer are described. In embodiments, III-N transistors include raised crystalline n+ doped source/drain structures on either side of a gate stack. In embodiments, an amorphous material is employed to limit growth of polycrystalline source/drain material, allowing a high quality source/drain doped crystal to grow from an undamaged region and laterally expand to form a low resistance interface with a two-degree electron gas (2DEG) formed within the device layer. In some embodiments, regions of damaged GaN that may spawn (Continued)

competitive polycrystalline overgrowths are covered with the amorphous material prior to commencing raised source/drain growth.

16 Claims, 9 Drawing Sheets

(51) Int. Cl.
*H01L 29/06* (2006.01)
*H01L 21/02* (2006.01)
*H01L 21/8258* (2006.01)
*H01L 29/08* (2006.01)
*H01L 29/205* (2006.01)
*H01L 29/20* (2006.01)
*H01L 21/8234* (2006.01)
*H01L 21/8252* (2006.01)

(52) U.S. Cl.
CPC .. *H01L 21/02488* (2013.01); *H01L 21/02513* (2013.01); *H01L 21/02647* (2013.01); *H01L 21/8258* (2013.01); *H01L 29/0657* (2013.01); *H01L 29/0847* (2013.01); *H01L 29/0891* (2013.01); *H01L 29/205* (2013.01); *H01L 29/66462* (2013.01); *H01L 21/8252* (2013.01); *H01L 21/823431* (2013.01); *H01L 29/2003* (2013.01)

(56) References Cited

U.S. PATENT DOCUMENTS

| | | | |
|---|---|---|---|
| 8,530,978 | B1 | 9/2013 | Chu et al. |
| 8,629,477 | B2 | 1/2014 | Lochtefeld et al. |
| 9,153,583 | B2 | 10/2015 | Glass et al. |
| 9,240,410 | B2 | 1/2016 | Then et al. |
| 2001/0040246 | A1 | 11/2001 | Ishii |
| 2002/0152952 | A1 | 10/2002 | Beaumont |
| 2006/0181828 | A1* | 8/2006 | Sato ............... H01L 27/15 361/91.1 |
| 2006/0197129 | A1 | 9/2006 | Wohlmuth |
| 2007/0278507 | A1 | 12/2007 | Nakazawa |
| 2008/0093622 | A1 | 4/2008 | Li |
| 2008/0099785 | A1 | 5/2008 | Bai |
| 2009/0039361 | A1 | 2/2009 | Li |
| 2010/0072576 | A1 | 3/2010 | Arena |
| 2010/0207138 | A1 | 8/2010 | Nakahata et al. |
| 2010/0213511 | A1 | 8/2010 | Lochtefeld |
| 2012/0119218 | A1 | 5/2012 | Su |
| 2012/0119220 | A1 | 5/2012 | Guo et al. |
| 2013/0015460 | A1 | 1/2013 | Chen et al. |
| 2013/0015525 | A1* | 1/2013 | Cheng ............ H01L 21/823814 257/351 |
| 2013/0043468 | A1 | 2/2013 | Adekore |
| 2013/0049013 | A1 | 2/2013 | Shimada |
| 2013/0105810 | A1 | 5/2013 | Nishimori |
| 2013/0228809 | A1 | 9/2013 | Chang et al. |
| 2013/0320353 | A1 | 12/2013 | Kryiouk et al. |
| 2014/0014966 | A1 | 1/2014 | Tabatabaie et al. |
| 2014/0042446 | A1 | 2/2014 | Chiang |
| 2014/0084300 | A1* | 3/2014 | Okamoto ............ H01L 29/2003 257/76 |
| 2014/0091845 | A1 | 4/2014 | Then et al. |
| 2014/0110759 | A1 | 4/2014 | Murata et al. |
| 2014/0239312 | A1 | 8/2014 | Shatalov et al. |
| 2014/0264321 | A1* | 9/2014 | Liang ............... H01L 21/30604 257/43 |
| 2015/0041860 | A1 | 2/2015 | Nishimori et al. |
| 2015/0263223 | A1 | 9/2015 | Ito |
| 2015/0340482 | A1 | 11/2015 | Padmanabhan et al. |
| 2016/0111496 | A1 | 4/2016 | Leobandung |

FOREIGN PATENT DOCUMENTS

| | | |
|---|---|---|
| JP | 2002249400 | 9/2002 |
| JP | 2007317794 | 12/2007 |
| JP | 2011210751 | 10/2011 |
| JP | 2013128135 | 6/2013 |
| JP | 2014078653 | 5/2014 |
| WO | 2011064997 | 6/2011 |
| WO | 2016209263 | 12/2016 |

OTHER PUBLICATIONS

Non-Final Office Action for U.S. Appl. No. 15/504,634, dated Feb. 23, 2018.
International Preliminary Report on Patentability for International Patent Application No. PCT/US2015/031542, dated Nov. 30, 2017.
Masui, Hisashi et al., "Geometrical Characteristics and Surface Polarity of Inclined Crystallographic Plane of the Wurzite and Zincblende Structures", Journal of Electronic Materials, vol. 38, No. 6, 2009.
International Preliminary Report on Patentability for International Patent Application No. PCT/ US2014/031903, dated Oct. 6, 2016.
International Search Report and Written Opinion for International Patent Application No. PCT/US2015/031542, dated Feb. 17, 2016.
International Search Report and Written Opinion for International Patent No. PCT2014/031903, dated Dec. 22, 2014.
International Search Report and Written Opinion for PCT/US14/56299 dated Jun. 16, 2015, 14 pages.
International Search Report for International Patent Application No. PCT/US2014/057474, dated Jun. 22, 2015.
Notice of Allowance for Taiwan Patent Application No. 104104764, dated Jul. 19, 2016.
Notice of Allowance for U.S. Appl. No. 15/120,705, dated Feb. 7, 2017.
Office Action and Search Report for Taiwan Patent Application No. 104104764, dated Feb. 24, 2016.
PCT Application No. PCT/14/56299, filed Sep. 18, 2014.
PCT Application No. PCT/US14/31903, filed Mar. 26, 2014.
PCT Application PCT/US14/57474, filed Dec. 25, 2014.
Restriction Requirement for U.S. Appl. No. 15/504,634, dated Aug. 30, 2017.
International Search Report and Written Opinion for International Patent Application No. PCT/US17/54471, dated Jun. 28, 2018.
International Search Report and Written Opinion from PCT/US2017/054566 dated Jun. 28, 2018, 17 pgs.
Notice of Reasons for Rejection for Japan Patent Application No. 2017-508522, dated Jun. 6, 2018.
Extended European Search Report for European Patent Application No. 14886974.6, dated Jul. 20, 2017.

* cited by examiner

SEMICONDUCTOR DEVICES WITH RAISED DOPED CRYSTALLINE STRUCTURES

CLAIM OF PRIORITY

This Application is a National Stage Entry of, and claims priority to, PCT Application No. PCT/US15/31542, filed on 19 May 2015 and titled "SEMICONDUCTOR DEVICES WITH RAISED DOPED CRYSTALLINE STRUCTURES," which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, including compound semiconductor materials (e.g., GaAs, InP, InGaAs, InAs, and III-N materials). III-N materials, as well as other materials with wurtzite crystallinity, such as, but not limited to AgI, ZnO, CdS, CdSe, α-SiC, and BN, show particular promise for high voltage and high frequency applications like power management ICs and RF power amplifiers. III-N heteroepitaxial (heterostructure) field effect transistors (HFET), such as high electron mobility transistors (HEMT) and metal oxide semiconductor (MOS) HEMT, employ a semiconductor heterostructure with one or more heterojunction, for example at an interface of a GaN semiconductor and another III-N semiconductor alloy, such as AlGaN or AlInN. GaN-based HFET devices benefit from a relatively wide bandgap (~3.4 eV), enabling higher breakdown voltages than Si-based MOSFETs, as well as high carrier mobility. The III-N material system is also useful for photonics (e.g., LEDs), photovoltaics, and sensors, one or more of which may be useful to integrate into an electronic device platform.

For many non-silicon device materials it can be challenging to provide doped semiconductor material suitable for making a good ohmic contact. Contact structures and techniques to reduce contact resistance and sheet resistance may advantageously reduce overall device resistance to enhance device performance and/or reduce device power consumption.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
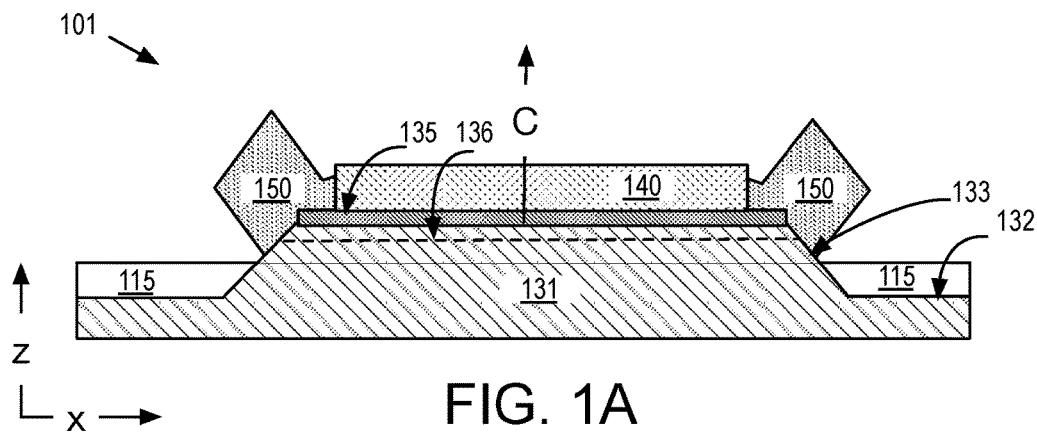
FIG. 1A is a cross-sectional view of a semiconductor device structure including a raised doped crystalline material wrapping-around a non-silicon crystalline edge of a recess lined with an amorphous material, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are heteroepitaxial structures including one or more raised crystalline doped semiconductor material regrown on a crystalline seeding surface adjacent to an amorphous material. In some embodiments, the amorphous material is disposed relative to a crystalline seeding surface to hinder growth of lower quality doped material (e.g., polycrystalline). Grown crystalline doped semiconductor material is ideally single crystalline for lowest sheet resistance and contact resistance to an underlying device layer. In some exemplary embodiments, a raised, or elevated, doped semiconductor material of wurtzite crystallinity is grown on a top surface of a polarization layer. In some embodiments, lateral growth of the doped crystalline material is promoted while an amorphous material blocks damaged regions of the growth substrate where competitive growths of low quality material might otherwise be nucleated. In some embodiments, the raised crystalline doped semiconductor material wraps around a sidewall of an underlying crystalline structure to make contact with a region of the device layer to interface a two-degree electron gas (2DEG).

As described below, raised epitaxial doped crystalline structures and techniques exemplified herein offer improved crystallinity, ideally single crystalline, particularly within wurtzite material systems, such as the GaN materials. In some advantageous embodiments, and as further exemplified below, nucleation of polycrystalline III-N material is selectively impeded through use of an amorphous growth mask material, which may be sacrificial, or permanently incorporated into the final device structure.

The inventors have found that doped semiconductor material grown from seeding surfaces that have sustained damaged, for example during a recess etch process, may have polycrystalline microstructure or extremely high dislocation densities. Such low-quality source/drain material may result in disadvantageously high device contact resistance. In accordance with embodiments described herein, nucleation of semiconductor material upon damaged surfaces may be deliberately hindered, for example through application of a mask of amorphous material to cover at least a portion of the damaged surface(s). Regrowth material may thereby nucleate primarily on undamaged seeding surfaces capable of forming doped material of better microstructure (ideally single crystalline). Where contact resistance or sheet resistance of the doped material is sufficiently improved, dimensional confinement by an amorphous masking material may be preferable to a more expansive doped material region of poorer material quality.

In some embodiments, a semiconductor device structure includes a raised doped crystalline material wrapping around a non-silicon crystalline edge of a recess that is at least partially lined with an amorphous material. FIG. 1A is a cross-sectional view of a semiconductor device structure 101 including a raised doped crystalline material 150 wrapping-around a non-silicon crystalline edge of a recess 132 that is at least partially filled or lined with an amorphous material 115, in accordance with some embodiments.

Recess 132 is disposed in a non-silicon crystalline body 131. In some embodiments, crystalline body 131 is a III-N material, such as, but not limited to AlN, GaN, AlGaN, InAlGaN. The inventors currently understand the structures and techniques described in detail in the context of a III-N material to be broadly applicable to a family of wurtzite semiconductors further including at least AgI, ZnO, CdS, CdSe, α-SiC, and BN, and may be further applicable to other non-silicon material systems, such as, but not limited to GaAs, InP, InAs, InGaAs, InGaP, etc. It is expected one of skill in the art familiar with the characteristics of these alternate semiconductor material systems will be able to successfully apply the techniques described herein absent some specific a priori knowledge of a salient incompatibility between the exemplary III-N material system described in detail herein and the alternate material system.

In some embodiments, crystalline body 131 has monocrystalline microstructure. Crystal quality of crystalline body 131 may vary dramatically as a function of the material composition and techniques employed to form crystalline body 131. For example, a III-N crystalline body 131 may have a dislocation density as high as $10^8$-$10^{11}$/cm$^2$. As further illustrated in FIG. 1A, in some III-N embodiments, the c-axis of a III-N crystalline structure 131 is ideally aligned approximately normal to a top surface of crystalline body 131. Practically however, the c-axis may be slightly tilted, for example a few degrees less than normal, for example as a result of imperfect epitaxial growth on an offcut or off-axis substrate, etc. In some embodiments, the {000-1} plane is more proximate a backside surface of crystalline body 131. Such embodiments may be referred to as Ga polarity (+c) because the three bonds of Ga (or other group III element) point towards a substrate (not illustrated). For alternate embodiments where the three bonds of Ga (or other group III element) point in the opposite direction, crystalline body 131 would be referred to as N polarity (−c).

Crystalline body 131 may be a portion of bulk substrate, or may be an epitaxial material disposed on a carrier substrate. In either embodiment, recess 132 extends only through a partial thickness of crystalline body 131. In the exemplary embodiment, recess 132 has a depth defined by recess edge 133 extending from a top surface of crystalline body 131 to a bottom of recess 132. The recess in a crystalline body may be partially backfilled with an amorphous material to prevent nucleation of doped crystalline material upon recess surfaces previously damaged by an etching process. In FIG. 1A, an amorphous material 115 is disposed over a bottom surface of recess 132.

In some embodiments, an amorphous dielectric composition is disposed within a recess in a non-silicon crystalline body. In some exemplary embodiments, amorphous material 115 is a dielectric offering good electrical isolation, such as, but not limited to alumina ($Al_2O_3$), silica (SiO), silicon nitrides (SiN), silicon oxynitrides (SiON), silicon carbonitrides (SiCN), or polymer dielectrics (e.g., benzocyclobutene). In some embodiments, amorphous material 115 is patterned into regions of dielectric material with regions of the recess surface free of amorphous material. In FIG. 1A, for example, a portion of recess edge 133 is free of amorphous material 115 and a top surface of amorphous material 115 is substantially planar. A planarized amorphous material 115 recessed below a top of recess edge 133 is indicative of amorphous material 115 being selectively etched back.

In some embodiments, one or more device layer material is disposed over a partially recessed non-silicon crystalline body. The one or more device layer material is crystalline and may be disposed over a sidewall or a top surface of an underlying crystalline body. In some embodiments, device layer materials are epitaxial having a microstructure and orientation derived from that of the underlying crystalline body providing a growth-seeding surface. The device layer materials may form a heterostructure comprising one or more heterojunction. In the context of an exemplary GaN crystalline body, device layer materials may include a GaN channel material, and one or more polarization layers (e.g., AlN, and/or AlInN, and/or AlGaN, and/or InGaN). Other device layer material may include one or more tunneling layer materials, quantum well structure materials, and the like. In exemplary embodiments represented in FIG. 1A, device layer materials include a polarization layer 135 disposed over a GaN channel region of crystalline body 131. Polarization layer 135 is to create a two dimensional electron gas (2DEG) 136 within the channel region.

In some embodiments, a raised doped crystalline material is in physical contact with at least one undamaged surface of a non-silicon crystalline body or device layer material. For such embodiments, the raised doped crystalline material has nucleated from the undamaged surface(s) and grown into a raised structure. Where damaged surface nucleation is limited by amorphous material, raised doped crystalline material can be substantially monocrystalline following undamaged microstructure of the crystalline body or device layer material. FIG. 1A illustrates a raised doped crystalline material 150 disposed on a surface of polarization layer 135. For some embodiments, raised doped crystalline material 150 has a dislocation density not more than one order more than that of the underlying crystalline body 131 and/or polarization layer 135. For example, in some exemplary GaN embodiments where crystalline body 131, and/or polarization layer 135, has a dislocation density of between $10^8$ $cm^{-2}$ and $10^{11}$ $cm^{-2}$, raised doped crystalline material 150 has a dislocation density of between $10^9$ $cm^{-2}$ and $10^{12}$ $cm^{-2}$. In contrast, raised doped material grown from damaged surface having a much great number of defects than present at the top surface of the device layer, the dislocation density would be many orders of magnitude greater in the best case, and more likely, simply polycrystalline.

Raised doped crystalline material may be of any composition known to be suitable for the device layer material compositions and/or device incorporating the device layer materials. In one exemplary embodiment where crystalline body 131 is GaN and a top surface of polarization layer 135 comprises another III-N material (e.g., AlInN), raised doped crystalline material 150 comprises a single crystal of InGaN. In further embodiments, the crystalline InGaN is n+ doped to function as source and/or drain regions of a transistor. The n+ doping level may be any typically employed for an N+ source/drain of a GaN device, as embodiments are not limited in this context.

In some embodiments, a raised doped crystalline material is in physical contact with more than one surface of an underlying non-silicon crystalline body or device layer material. In FIG. 1A, raised doped crystalline material 150 extends, or "wraps," around both a top surface of polarization layer 135 and at least a portion of recess edge 133. Raised doped crystalline material 150 is in intimate contact with recess sidewall 133 In the context of semiconductor device structure 101, device functionality may be significantly affected by the quality of the interface between the 2DEG 136 and raised doped crystalline material 150. Where, as illustrated in FIG. 1, raised doped crystalline material 150 interfaces the 2DEG 136 through the recess edge 133, the inventors have found that lower contact resistance may be achieved with a doped crystalline material that is substantially single crystalline and has been grown with a growth front that originates from a crystalline surface undamaged by prior processing, such as the top surface of polarization layer 135.

Figure 1B:
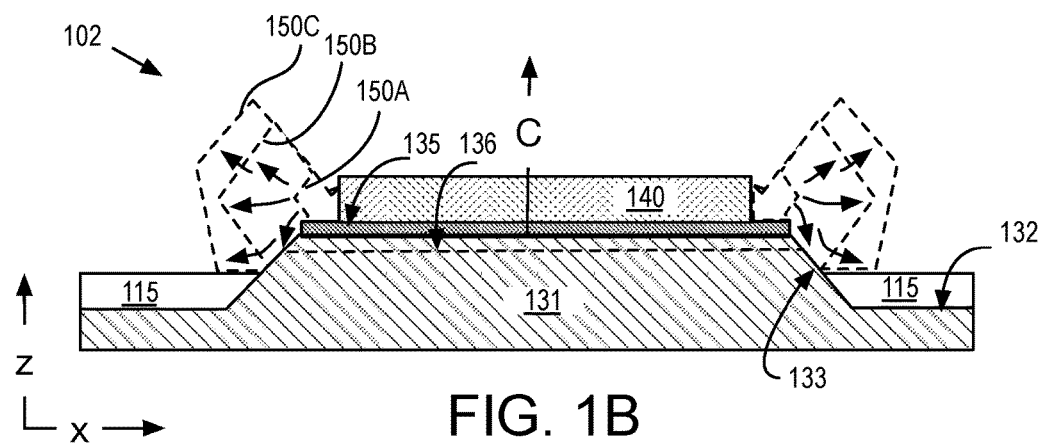
FIG. 1B is a cross-sectional view of a semiconductor device structure further depicting a raised doped crystalline material as the crystal growth front evolves to meet a non-silicon crystalline edge of a recess, in accordance with some embodiments.

FIG. 1B further illustrates movement of a growth front of raised doped crystalline material 150, in accordance with some embodiments. As shown, initial raised doped crystalline material 150A grows from a top c-plane surface of polarization layer 135 not covered by growth mask 140. Nucleation on the recess sidewall 133 may be relatively slower because of growth conditions and/or a condition of the microstructure along recess sidewall 133. After additional growth time, initial raised doped crystalline material 150A has expanded into intermediate raised doped crystalline material 150B. Without extensive nucleation at recess sidewall 133, a surface of the initial raised doped crystalline material 150A intersecting recess sidewall 133 can laterally advance down the recess sidewall 133 as a single crystal (as depicted by the growth front arrows) to form intermediate raised doped crystalline material 150B having an intimate material junction with recess sidewall 133. Likewise, with competitive nucleation at the bottom of recess 132 prevented by amorphous material 115, a surface of the intermediate raised doped crystalline material 150B intersecting amorphous material 115 can laterally advance across amorphous material 115 as a single crystal to form extended raised doped crystalline material 150C having good (low) sheet resistance. Growth time may be adjusted to achieve a less-extend raised doped crystalline material (e.g., 150 in FIG. 1A), or a more-extended raised doped crystalline material (e.g., 150C in FIG. 1B), as a matter of device design choice.

In some embodiments, lateral epitaxial growth is performed for sufficient duration to ensure raised doped crystalline material 150 covers the portion of crystalline body 131 where 2DEG 136 resides. In further embodiments, growth is halted with at least a portion of recess sidewall 133 not covered by raised doped crystalline material 150, as depicted in FIG. 1A. In such embodiments, substrate leakage from raised doped crystalline material 150 may be less than for other embodiments where raised doped crystalline material 150 allowed to form over the entire depth of recess sidewall 133 (e.g., as depicted for extended raised doped crystalline material 150C in FIG. 1B).

Figure 2:
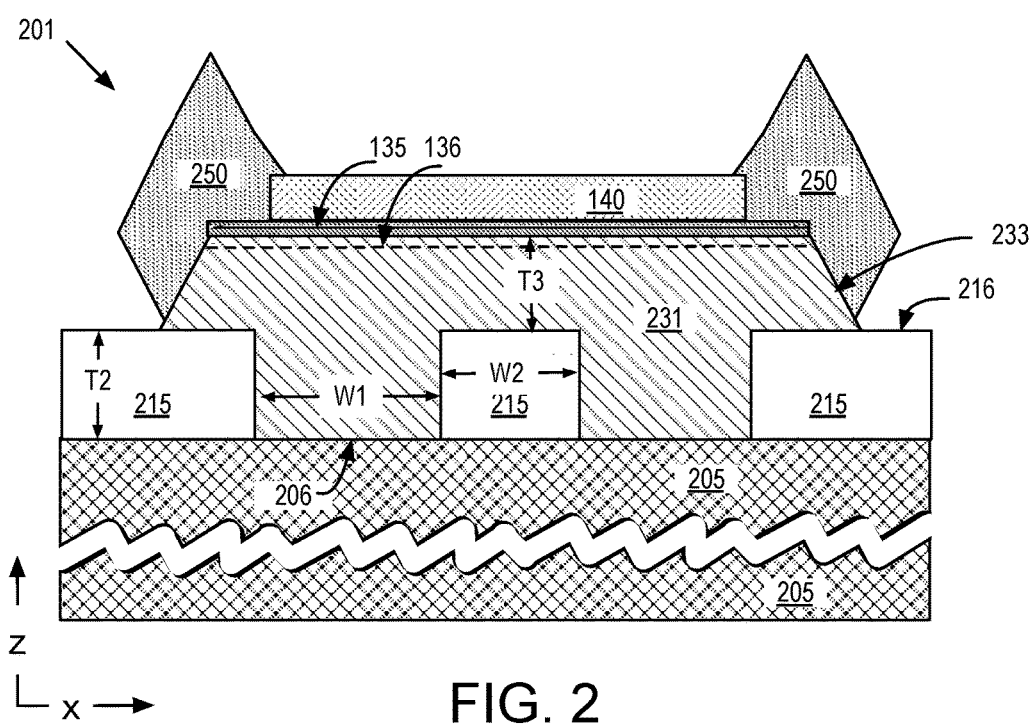
FIG. 2 is a cross-sectional view of a semiconductor device structure including a raised doped crystalline material wrapping-around a raised non-silicon crystalline body extending over an amorphous material, in accordance with some embodiments.

In some embodiments, a semiconductor device structure includes a raised doped crystalline material wrapping around a non-silicon crystalline edge of a raised crystalline body that extends over an underlying amorphous material. FIG. 2 is a cross-sectional view of a semiconductor device structure 201 including a raised doped crystalline material 250 wrapping-around a raised non-silicon crystalline body 231 extending over an amorphous material 215, in accordance with some embodiments. For such embodiments, rather than backfilling a recess as described above, amorphous material 215 is first employed as a template growth mask and then leveraged to prevent subsequent overgrowth of raised doped crystalline material 250 into adjacent structures.

Crystalline body 231 may have any of the compositions described above for crystalline body 131. In some embodiments, raised crystalline body 231 is a III-N material (e.g., AlN, GaN, AlGaN, InAlGaN, etc.). In some embodiments, crystalline body 231 is another wurtzite semiconductor further including at least AgI, ZnO, CdS, CdSe, α-SiC, and BN. In some embodiments, raised crystalline body 231 has zinc-blende crystallinity, including, but not limited to GaAs, InP, InAs, InGaAs, InGaP, etc.

In some embodiments, raised crystalline body 231 has monocrystalline microstructure. Crystal quality of crystalline body 231 may vary dramatically as a function of the material composition and techniques employed to grow raised crystalline body 231 from substrate 205. For example, a III-N crystalline body 231 may have a dislocation density as high as $10^8$-$10^{11}$/cm$^2$. As further illustrated in FIG. 2, in some III-N embodiments, the c-axis of a raised III-N crystalline structure 231 is ideally aligned approximately normal to a top surface of crystalline body 231. Practically however, the c-axis may be slightly tilted, for example a few degrees less than normal, for example as a result of imperfect epitaxial growth on an offcut or off-axis substrate, etc. In some embodiments, the {000-1} plane is more proximate a backside surface of crystalline body 231. Such embodiments may be referred to as Ga polarity (+c) because the three bonds of Ga (or other group III element) point towards a substrate (not illustrated). For alternate embodiments where the three bonds of Ga (or other group III element) point in the opposite direction, crystalline body 231 would be referred to as N polarity (−c).

In some embodiments, raised crystalline body 231 is disposed over a crystalline surface, which in the exemplary embodiment is a surface region of substantially monocrystalline substrate 205 having a predetermined crystal orientation. Substrate 205 may be a variety of materials, including, but not limited to, silicon, germanium, SiGe, III-V compounds like GaAs, InP, and 3C-SiC. In the exemplary embodiment substrate 205 is silicon, which is advantageous for monolithic integration of HFETs with conventional silicon MOSFETs. Crystallographic orientation of a substantially monocrystalline substrate 205 may be any of (100), (111), or (110). Other crystallographic orientations are also possible. In one exemplary silicon substrate embodiment, substrate 205 is (100) silicon. For a (100) substrate 205, the semiconductor surface may advantageously miscut, or offcut, for example 2-10° toward [110], to facilitate nucleation of raised crystalline structure 231.

Also disposed over the substrate crystalline surface is an amorphous material 215. Amorphous material 215 can have any of the compositions previously described for amorphous material 115. In some exemplary embodiments, amorphous material 215 is a dielectric, such as, but not limited to alumina ($Al_2O_3$), silica (SiO), silicon nitrides (SiN), silicon oxynitrides (SiON), silicon carbonitrides (SiCN), or polymer dielectrics (e.g., benzocyclobutene). In some embodiments, amorphous material 215 is an amorphous dielectric material patterned into stripes with regions of the substrate crystalline surface disposed between the stripes. In one exemplary embodiment where the substrate is (100) silicon, the trenches and stripes of dielectric material have their longest lengths aligned with the <110> direction of the substrate.

Amorphous material thickness T2 may vary widely (e.g., 10nm-200nm), as may width W1 (e.g., 20nm-500nm). Lateral width W2 of amorphous material features may also vary significantly, for example from 100nm to 1 μm. Raised crystalline body 231 may be grown to an arbitrary height as a function of amorphous template material dimensions, epitaxial growth conditions and growth duration, etc. Lateral overgrowth over the amorphous material top surface 216 may also vary with implementation.

In some embodiments, one or more device layer material is disposed over a raised non-silicon crystalline body. The one or more device layer material is crystalline and may be disposed over a sidewall or a top surface of a raised crystalline body. In some embodiments, device layer materials are epitaxial having a microstructure and orientation derived from that a growth-seeding surface of an underlying crystalline body. As previously described above, the device layer materials may form a heterostructure comprising one or more heterojunction. In the context of an exemplary raised GaN crystalline body, device layer materials may include a GaN channel material, and one or more polarization layers (e.g., AlN, and/or AlInN, and/or AlGaN, and/or InGaN). Other device layer material may include one or more tunneling layer materials, quantum well structure materials, and the like. In some exemplary embodiments represented in FIG. 2, device layer materials include a polarization layer 135 disposed over a GaN channel region of raised crystalline body 231. Polarization layer 135 is to create a two dimensional electron gas (2DEG) 136 within the channel region.

In some embodiments, a raised doped crystalline material is in physical contact with at least one undamaged surface of a raised non-silicon crystalline body or device layer material. Raised doped crystalline material 250 may be of any of the composition previously described for raised doped crystalline material 150. In one exemplary embodiment where raised crystalline body 231 is GaN and a top surface of polarization layer 135 comprises another III-N material (e.g., AlInN), raised doped crystalline material 250 comprises a single crystal of InGaN. In further embodiments, the crystalline InGaN is n+ doped to function as a transistor source and/or drain. The n+ doping level may be any typically employed for an N+ source/drain of a GaN device, as embodiments are not limited in this context.

In some embodiments, a raised doped crystalline material is in physical contact with more than one surface of an underlying non-silicon crystalline body or device layer material. In FIG. 2, raised doped crystalline material 250 extends, or "wraps," around both a top surface of polarization layer 135 and at least a portion of raised edge 233.

Raised doped crystalline material 250 is in intimate contact with raised edge 233 that extends beyond an underlying amorphous material 215. As described above, a raised doped crystalline material advantageously nucleates from undamaged surface(s). Amorphous material 215 will not nucleate raised doped crystalline material. A high quality (mono) crystalline doped material may therefore be grown to provide good contact resistance to regions of the raised crystalline body 231 and further provide good sheet resistance within any doped material laterally extending over amorphous material 215.

In some embodiments, the top surface of polarization layer 135 not covered by growth mask 140 is undamaged. Raised edge 233 may also be an undamaged crystalline surface fresh from a lateral epitaxial overgrowth of raised crystalline body 231. Prior growth of device layers (e.g., polarization layer 135) may have preferentially nucleated at the top surface (c-plane) of raised body 231, rather than on raised edge 233. Raised doped crystalline material 250 may the be in intimate physical contact with multiple undamaged surfaces including the top surface of polarization layer 135 and raised sidewall 233. For such embodiments, raised doped crystalline material 250 may have nucleated at either, or both, of these undamaged surfaces.

In other embodiments, raised sidewall 233 may be damaged, for example as a result of prior processing to remove a portion of polarization layer 135 and expose 2DEG 136 intersecting raised sidewall 233. For such embodiments, raised sidewall 233 may have essentially the same attributes as described above in the context of recess sidewall 133 (FIG. 1A). Raised doped crystalline material 250 is then advantageously nucleated from a top surface of polarization layer 135 with the growth front proceeding to extend over raised sidewall 233 with longer growth time, substantially as described above for embodiments having an etch-damaged recess sidewall (FIG. 1B). Regardless of a high number of crystal defects at raised sidewall 233, raised doped crystalline material 250 is advantageously monocrystalline following undamaged microstructure of crystalline body or device layer material. For some embodiments represented by FIG. 2, raised doped crystalline material 250 has a dislocation density not more than one order more than that of the underlying raised crystalline body 231, and/or polarization layer 135. For example, in some exemplary GaN embodiments where raised crystalline body 231, and/or polarization layer 135, has a dislocation density of between $10^8$ cm$^{-2}$ and $10^{11}$ cm$^{-2}$, crystalline contact material 250 has a dislocation density of between $10^9$ cm$^{-2}$ and $10^{12}$ cm$^{-2}$.

Figure 3:
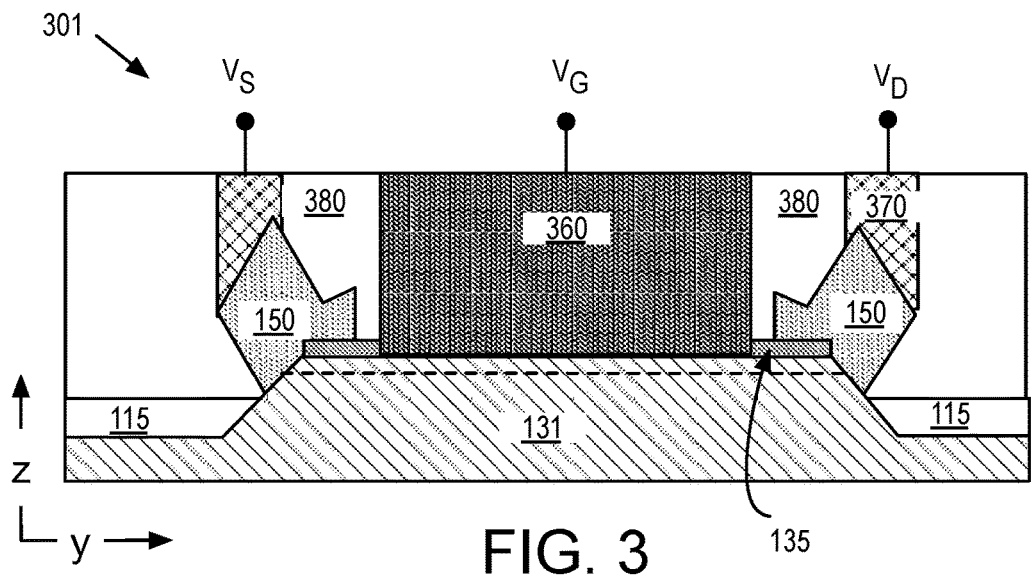
FIGS. 3 and 4 are cross-sectional views depicting GaN transistors including raised wrap-around crystalline source/drain material, in accordance with some embodiments.
Figure 4:
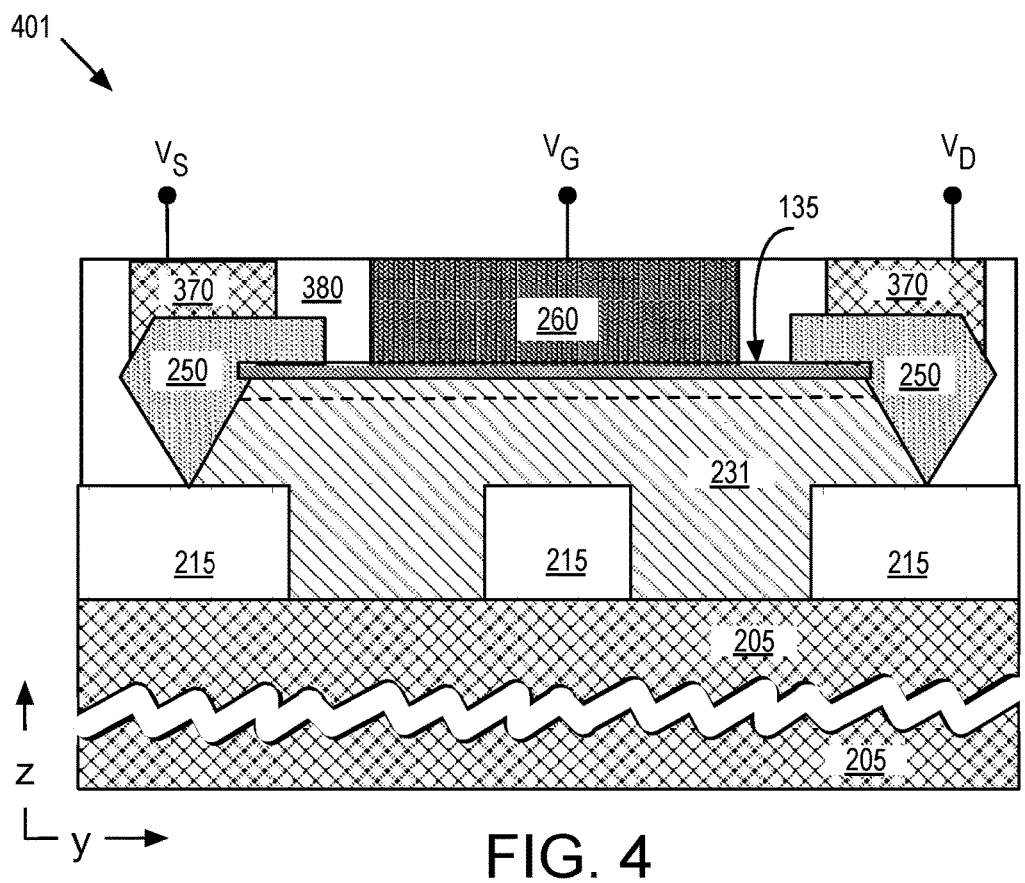

FIG. 3 and FIG. 4 are cross-sectional views depicting GaN transistors 301 and 401, respectively, that include raised wrap-around doped crystalline material, in accordance with some embodiments. Exemplary III-N HFET embodiments are depicted. However, the inventors currently understand the structures and techniques described herein to be broadly applicable to many other semiconductor devices including at least transistors (e.g., further including HBTs) and (photo)diodes for LED, photonic, or photovoltaic applications. Therefore, it is expected one of skill in the art familiar with the characteristics of an alternate semiconductor device will be able to successfully apply the techniques described herein absent some specific a priori knowledge of a salient incompatibility between exemplary HFET device(s) and the alternate device(s).

In some III-N HFET embodiments in accordance with transistors 301 and 401, a gate terminal 360 is disposed over a gate dielectric (not depicted). The gate terminal and gate dielectric comprise a gate stack over III-N polarization layer 135 and channel region of either non-recessed III-N crystalline structure 131 or raised III-N crystalline structure 231. Gate terminal 260 may be any metal or semiconductor known to have suitable conductivity and work function difference from a channel semiconductor layer disposed below III-N polarization layer 135. The gate dielectric, if present, may be any high-k or conventional dielectric material known to be suitable for III-N FETs.

In some embodiments, a single crystalline raised doped material is surrounded by interlayer dielectric. As illustrated in FIG. 3 and FIG. 4, surfaces of raised contact material 150 and 250 are encapsulated within a planarized dielectric 380. Device terminal metallization 370 may further couple to raised doped crystalline material 150, 250 following any known architecture. In the exemplary embodiment illustrated in FIG. 3, raised wrap-around doped crystalline material 150 is unplanarized, with contact metallization 370 extending down through an overlying planarized interlayer dielectric (ILD) 380 and landing on an unplanarized surface of crystalline contact material 150. In the exemplary embodiment illustrated in FIG. 4, raised wrap-around crystalline n+ doped material 250 is planarized, with contact metallization 370 extending down through ILD 380 and landing on a planarized surface of crystalline n+ doped material 250. A top surface of contact metallization 370 is substantially planar with gate stack 360. In some further embodiments, a System-On-Chip (SoC) includes silicon-based transistors (not depicted) that are disposed over a first crystalline surface region, and non-silicon-based transistors, such as HFET 401, that are disposed over a second crystalline surface region.

The semiconductor heterostructures and semiconductor devices described above may be fabricated using a variety of methods. Epitaxial overgrowth of raised doped crystalline material may utilize a variety of techniques and processing chamber configurations. In embodiments, lateral epitaxial overgrowth conditions are engineered to favor advancing a lateral growth face of a nucleated crystal.

Figure 5:
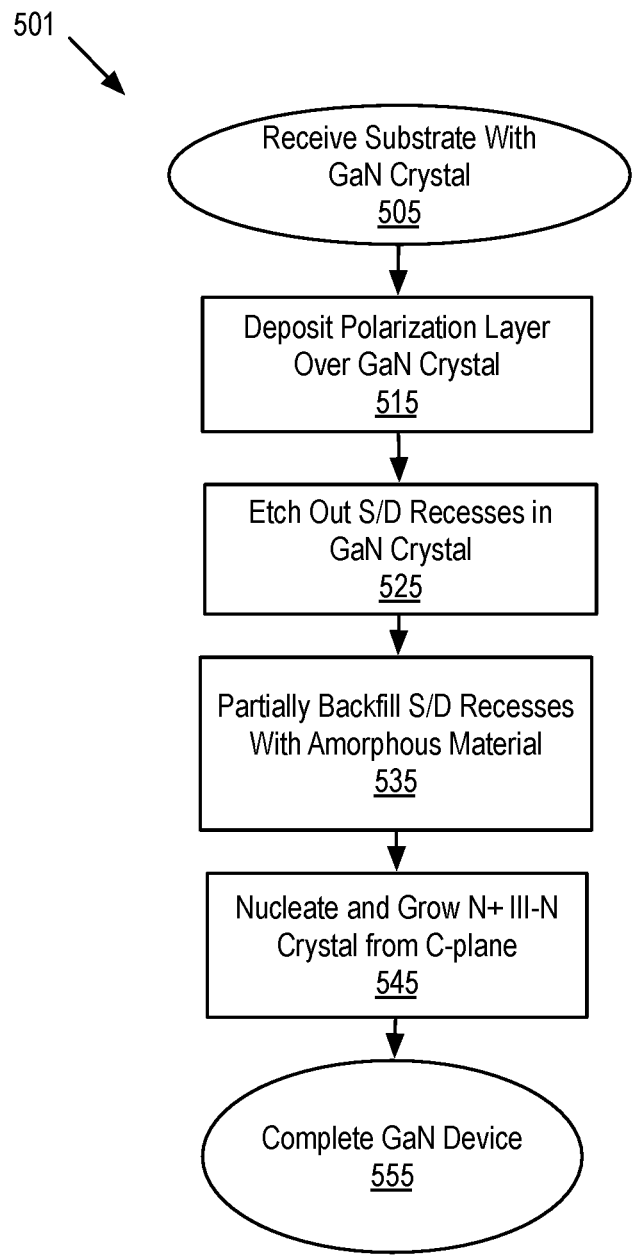
FIGS. 5 and 6 are flow diagrams illustrating methods of forming raised wrap-around crystalline source/drain material, in accordance with embodiments.

FIG. 5 is a flow diagram illustrating a method 501 of forming GaN transistor with raised crystalline contact material, in accordance with embodiments. Method 501 may be utilized to form the semiconductor heterostructure 101 (FIG. 1A), and further form GaN transistor 301 (FIG. 3).

Method 501 (FIG. 5) begins with receiving a substrate including a crystalline GaN material layer at operation 505. In some embodiments, III-N epitaxial growth process is employed upstream of method 501 to form the GaN crystal on a native or non-native substrate. Method 501 continues at operation 515 where a polarization material layer is deposited over a surface of the GaN material. Any known technique may be utilized to grow or deposit polarization material at operation 515. At operation 525, recesses are etched out of the crystalline GaN material layer. In some embodiments, for example a mask is deposited over the polarization material and patterned to protect the polarization layer during a subsequent recess etch. In some embodiments, the recess etch performed at operation 525 entails exposing unmasked portions of the GaN material layer to a plasma-energized etchant species. Any plasma etch process known to be suitable for recess etching GaN may be utilized at operation 525 as embodiments are not limited in this respect.

Method 501 continues at operation 535 where the recess(es) formed at operation 525 are partially backfilled with an amorphous material. Any of the amorphous materials described above may be deposited at operation 535. Any known shallow trench isolation deposition and/or etchback process may be employed at operation 535. In some embodiments, amorphous dielectric material is conformally deposited and polished back to leave amorphous material only within recesses, for example with any known chemical-mechanical polishing (CMP) process. In some embodiments, an amorphous dielectric material is super-conformally deposited to form amorphous material only within recesses, for example with any known spin-on or super-fill process.

Method 501 continues at operation 545 where raised doped crystalline material is epitaxially grown from an exposed, undamaged surface of GaN material. In some embodiments, a material masking a polarization layer during recess etching operation 525 is laterally etched to expose an edge portion of the underlying polarization material adjacent to an edge of the recess formed at operation 525. In further embodiments, an epitaxial process may be employed to grow raised doped III-N contact material, such as n+ doped InGaN source/drain material at nucleation sites on an exposed c-plane of the polarization material. Operation 545 may rely on first epitaxial growth conditions (e.g., a first III-N growth pressure, a first III-N growth temperature, and a first V/III growth precursor ratio), and may further include multiple growth conditions. Following an initial growth period, growth conditions may be changed to favor lateral epitaxial overgrowth (LEO) of raised doped crystalline material (e.g., n+ InGaN) to wrap the material around sidewalls of the recess formed at operation 525. In some embodiments, the lateral epitaxial growth remains crystalline as it advances over any damaged GaN surfaces of the recess sidewalls, intimately contacting the recess sidewalls in a region of a 2DEG.

In further embodiments, raised doped source/drain material may also be expanded dimensionally during a second growth stage performed following removal of at least a portion the amorphous growth mask material after the amorphous material has been utilized to block nucleation of lower quality doped source/drain material. For example, an amorphous material may be utilized during a first growth stage to ensure a 2DEG interfaces to a single crystalline doped semiconductor. The amorphous mask may then be removed and a second quantity of doped semiconductor grown during a second phase where doped polycrystalline source/drain material is more acceptable.

At operation 555, a GaN device is completed by forming a gate stack over the polarization layer within a channel region of the device with any known technique. Material(s) masking the polarization layer within the channel region may be removed, and polarization layer thinned (if desired). Also, at operation 555, ILD and metallization contacting the raised doped crystalline material may be formed by any technique known in the art.

Figure 6:
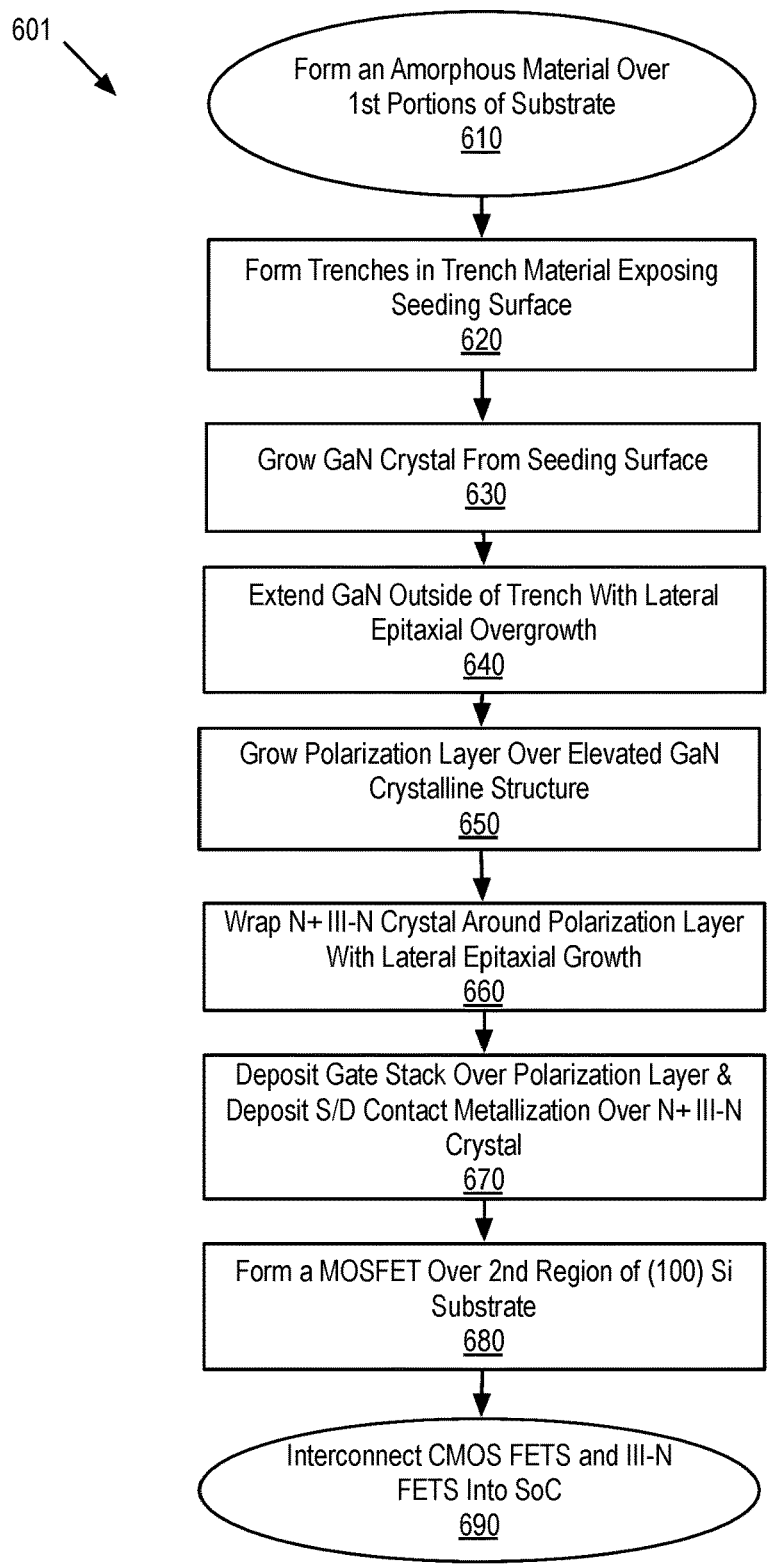

FIG. 6 is flow diagram illustrating a method 601 for forming a SoC including silicon MOSFETs and GaN HFETs with raised wrap-around crystalline source/drain material, in accordance with embodiments. Method 601 may be utilized to form the HFET 401 (FIG. 4), for example. FIGS. 7A, 7B, 7C, 7D, 7E, 7F, 7G, and 7H are cross-sectional views of an SoC evolving as selected operations in the method illustrated in FIG. 6 are performed, in accordance with embodiments.

Figure 7A:
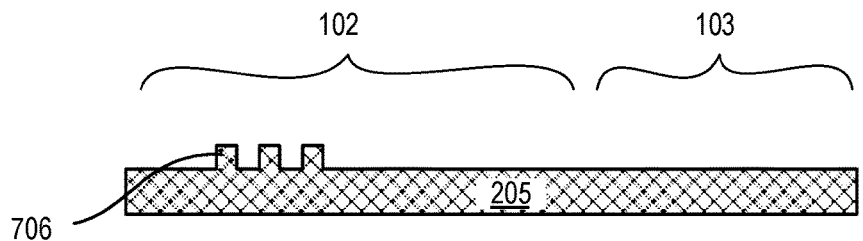
FIGS. 7A, 7B, 7C, 7D, 7E, 7F, 7G, and 7H are cross-sectional views of an SoC evolving as selected operations in the method illustrated in FIG. 6 are performed, in accordance with embodiments.
Figure 7B:
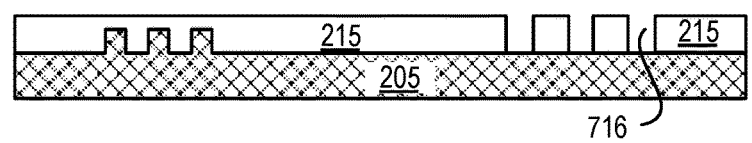
Figure 7C:
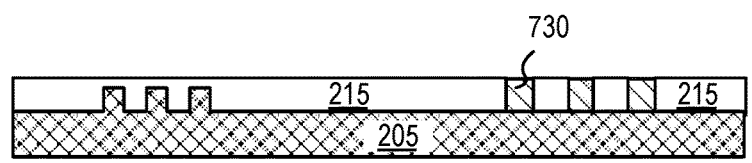
Figure 7D:
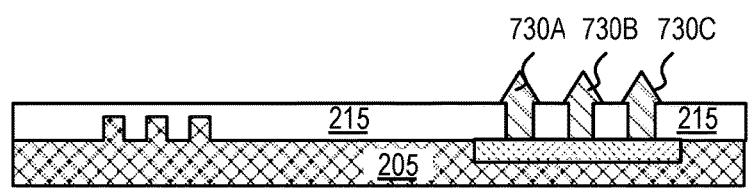
Figure 7E:
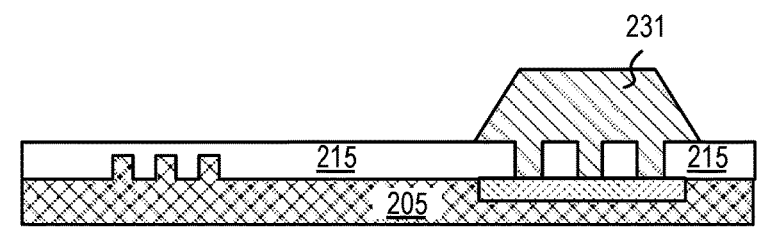
Figure 7F:
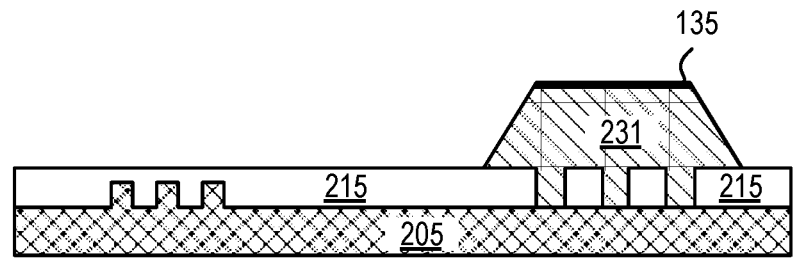
Figure 7G:
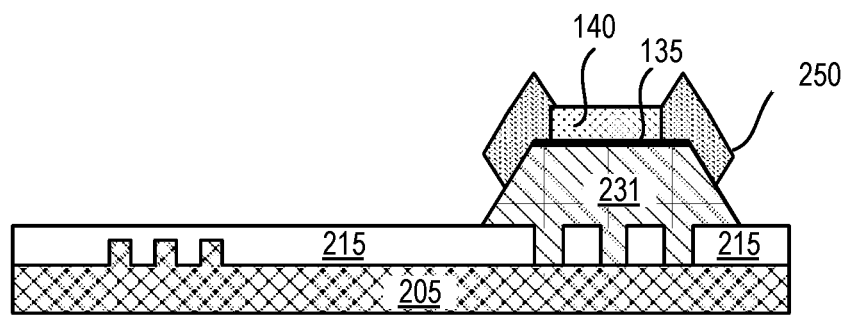
Figure 7H:
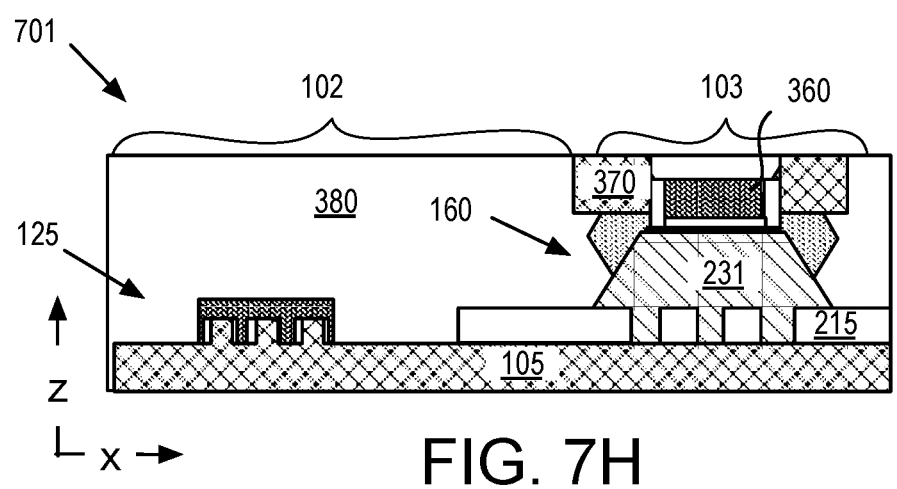

Referring first to FIG. 6, method 601 begins with forming an amorphous material over a first region or portion of a substrate. In some embodiments, the amorphous material is a dielectric deposited with any technique known to be suitable for the material. At operation 620, the amorphous material is patterned, for example to form trenches in the amorphous material that expose a crystalline seeding surface of the substrate. The crystalline seeding surface may be a surface of the bulk substrate or of some interfacial material of the substrate. For some embodiments, the amorphous material is to serve as both a template for subsequent non-silicon epitaxial growth, and further as a mask confining subsequent overgrowth of raised source/drain material. Any pattern transfer technique may be utilized at operation 620. While any template structure known to be suitable for heteroepitaxial growth of a non-silicon crystal may be employed at operation 620, in exemplary embodiments including a (100) cubic semiconductor surface, the template comprises trenches extending in a <110> direction of the substrate. The template structures, for example, expose stripes of a (100) silicon surface. FIG. 7A further illustrates one exemplary embodiment where substrate 205 includes both a first (silicon CMOS) region 102 having fin structures 706, and a second region 103 where a raised crystalline structure is to be formed. As further depicted in 7B, amorphous material 215 is patterned into a template structure.

Returning to FIG. 6, at operation 630 a III-N material (e.g., GaN) is grown from the exposed seeding surface to backfill the template structure (e.g., backfill the trench stripes). Material growth may be by any known technique, such as, but not limited to metal-organic chemical vapor deposition (MOCVD), or molecular beam epitaxy (MBE). In some embodiments, elevated temperatures of 900° C., or more, are employed at operation 630 to epitaxially grow a GaN crystalline structure. When the template structure is substantially backfilled (i.e., amorphous material planarized), growth conditions may be changed to favor lateral epitaxial overgrowth (LEO) of the III-N crystalline structure over the amorphous template material at operation 640. In some embodiments, the LEO process employed at operation 640 favors formation of inclined sidewall facets. Overgrowth at rates that favor wurtzite crystal facets non-parallel and non-normal to the c-plane have been found to bend defects away from the c-plane and toward the sidewalls such that quality of a top surface of the III-N crystalline structure improves with overgrowth time. In the exemplary embodiment further illustrated in FIG. 7C, upon termination of operation 630, III-N crystalline structure 730 is substantially planar with amorphous material 215. As further illustrated in FIG. 7D, raised II-N crystalline structures 730A, 730B, and 730C having peaked profiles are formed during an initial portion of operation 640. With additional LEO, the peaks 730A-C expand into trapezoidal profiles, which continue expand into a merged raised structure 231 illustrated in FIG. 7E.

Returning to FIG. 6, at operation 650, a III-N polarization layer is grown over the raised III-N crystalline structure formed by the LEO operation 640. Any conventional epitaxial process may be employed to form the III-N polarization layer. In some embodiments, the polarization layer is grown in conditions that favor growth from the c-plane of the raised III-N crystalline structure. Depending on growth conditions and properties of the raised III-N crystalline structure sidewalls, very little III-N polarization material, or none at all, may form on the sidewalls of the raised III-N crystalline structure during operation 650. As further illustrated in FIG. 7F, a polarization layer 135 is grown on the elevated crystalline structure 231.

Returning to FIG. 6, at operation 660, raised III-N crystalline source/drain material is epitaxially grown on a region of raised III-N crystalline structure formed by the LEO operation 640 and/or on a region of a III-N polarization layer formed at operation 650. The raised III-N crystalline source/ drain material may be grown with any epitaxial process known to be suitable for the chosen source/drain material. In some embodiments, n+ (Si) doped InGaN is grown by MOCVD, MBE, or the like. In some embodiments, before growing the raised III-N crystalline source/drain material, a sacrificial masking material is formed and/or patterned over a portion of the III-N polarization layer overlying a channel region of the raised III-N crystalline structure. The raised III-N crystalline source/drain material is then grown around the masking material. In some embodiments, any III-N polarization material disposed on regions of the raised III-N crystalline structure where the crystalline source/drain material is to interface with the 2DEG may be removed prior to commencing the raised III-N crystalline source/drain material growth. Any etchant and etching process known to remove the particular polarization material may be utilized for this purpose.

The sacrificial masking material and amorphous material formed at operation 610 may confine the raised III-N crystalline source/drain material growth. In some embodiments, the raised III-N crystalline source/drain material is initially grown with conditions that favor growth from the c-plane of exposed polarization material. Subsequently, a LEO process is performed to laterally overgrow the raised III-N crystalline source/drain material over a sidewall portion of raised III-N crystalline structure. In some embodiments where the LEO process is sufficiently long, the raised III-N crystalline source/drain material is laterally grown over at least a portion of the amorphous material formed at operation 610. As further illustrated in FIG. 7G, raised III-N (e.g., n+ InGaN) crystalline source/drain material 250 is laterally overgrown from a nucleation site on polarization layer 135, wrapping down a sidewall of raised III-N (e.g., GaN) crystalline structure 231.

Returning to FIG. 6, method 601 continues at operation 670 where a gate stack is deposited over the polarization layer within the HFET channel region. Source/drain metallization is contacted to the raised crystalline source/drain material formed at operation 660. In some embodiments, the masking material disposed over the channel region during operation 660 is further utilized as a sacrificial mandrel where a gate stack of the HFET is to be formed. Following removal of the masking material, the polarization layer may be thinned (e.g., in recessed gate embodiment). In some embodiments, a dielectric spacer is formed in the recess left by the masking material as insulation between the doped crystalline material formed at operation 660 and the gate stack. In the exemplary embodiment further illustrated in FIG. 7H, formation of the gate stack 360 further entails deposition of a gate dielectric and deposition of a gate electrode within the recess where the masking material was removed. Any known dielectric deposition process, such as CVD and ALD may be utilized to form the gate dielectric. Any known metal deposition process, such as CVD, ALD, and/or PVD may be utilized to form the gate electrode. ILD 380 may be further deposited and/or planarized before or after formation of the gate stack. Any known technique may be utilized to form contact metallization 370.

Method 601 (FIG. 6) continues at operation 680, a where silicon-based MOSFET is formed over the substrate. Any known MOSFET fabrication process may be enlisted at operation 680. In the exemplary embodiment further illustrated in FIG. 7H, a non-planar MOSFET 125 (e.g., finFET) is formed using any known technique. In alternate embodiments, a planar MOSFET is formed. Method 601 (FIG. 6) ends at operation 690 with interconnection of silicon-based MOSFET and III-N-based HFET using any known backend metallization process.

Figure 8:
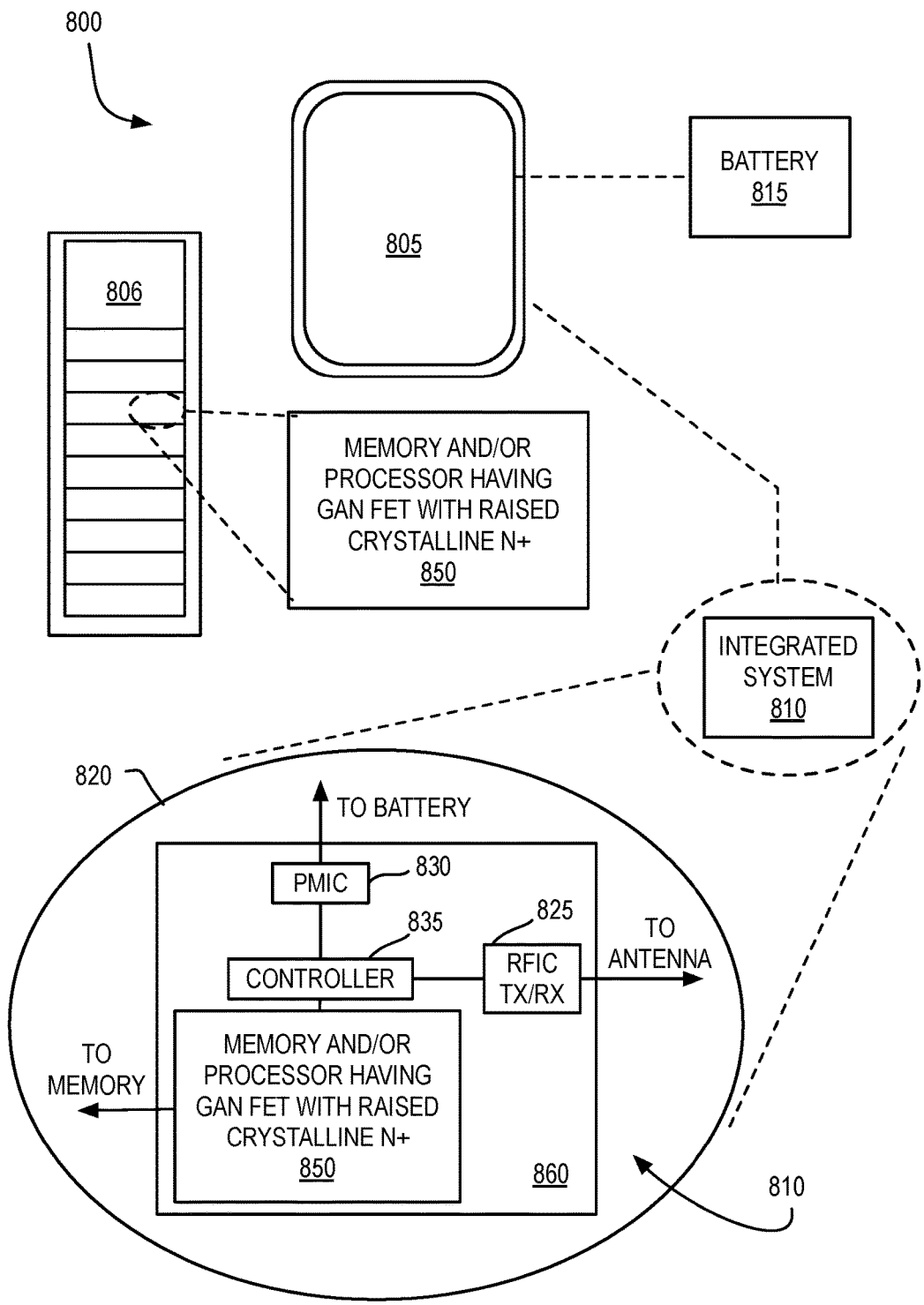
FIG. 8 illustrates a mobile computing platform and a data server machine employing an SoC including silicon FETs on silicon, and GaN HFETs including raised wrap-around crystalline source/drain material, in accordance with embodiments of the present invention.

FIG. 8 illustrates a system 800 in which a mobile computing platform 805 and/or a data server machine 806 employs an IC including at least one GaN HFET including raised crystalline contact material, in accordance with embodiments of the present invention. The server machine 806 may be any commercial server, for example including any number of high-performance computing platforms disposed within a rack and networked together for electronic data processing, which in the exemplary embodiment includes a packaged monolithic IC 850. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone packaged chip within the server machine 806, packaged monolithic IC 850 includes a memory chip (e.g., RAM), or a processor chip (e.g., a microprocessor, a multi-core microprocessor, graphics processor, or the like) including at least one III-N HFET disposed over a HT-stable interfacial layer, for example as describe elsewhere herein. The monolithic IC 850 may be further coupled to a board, a substrate, or an interposer 860 along with, one or more of a power management integrated circuit (PMIC) 830, RF (wireless) integrated circuit (RFIC) 825 including a wideband RF (wireless) transmitter and/or receiver (TX/RX) (e.g., including a digital baseband and an analog front end module further comprises a power amplifier on a transmit path and a low noise amplifier on a receive path), and a controller thereof 835.

Functionally, PMIC 830 may perform battery power regulation, DC-to-DC conversion, etc., and so has an input coupled to battery 815 and with an output providing a current supply to other functional modules. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 850 or within a single IC coupled to the package substrate of the monolithic IC 850.

Figure 9:
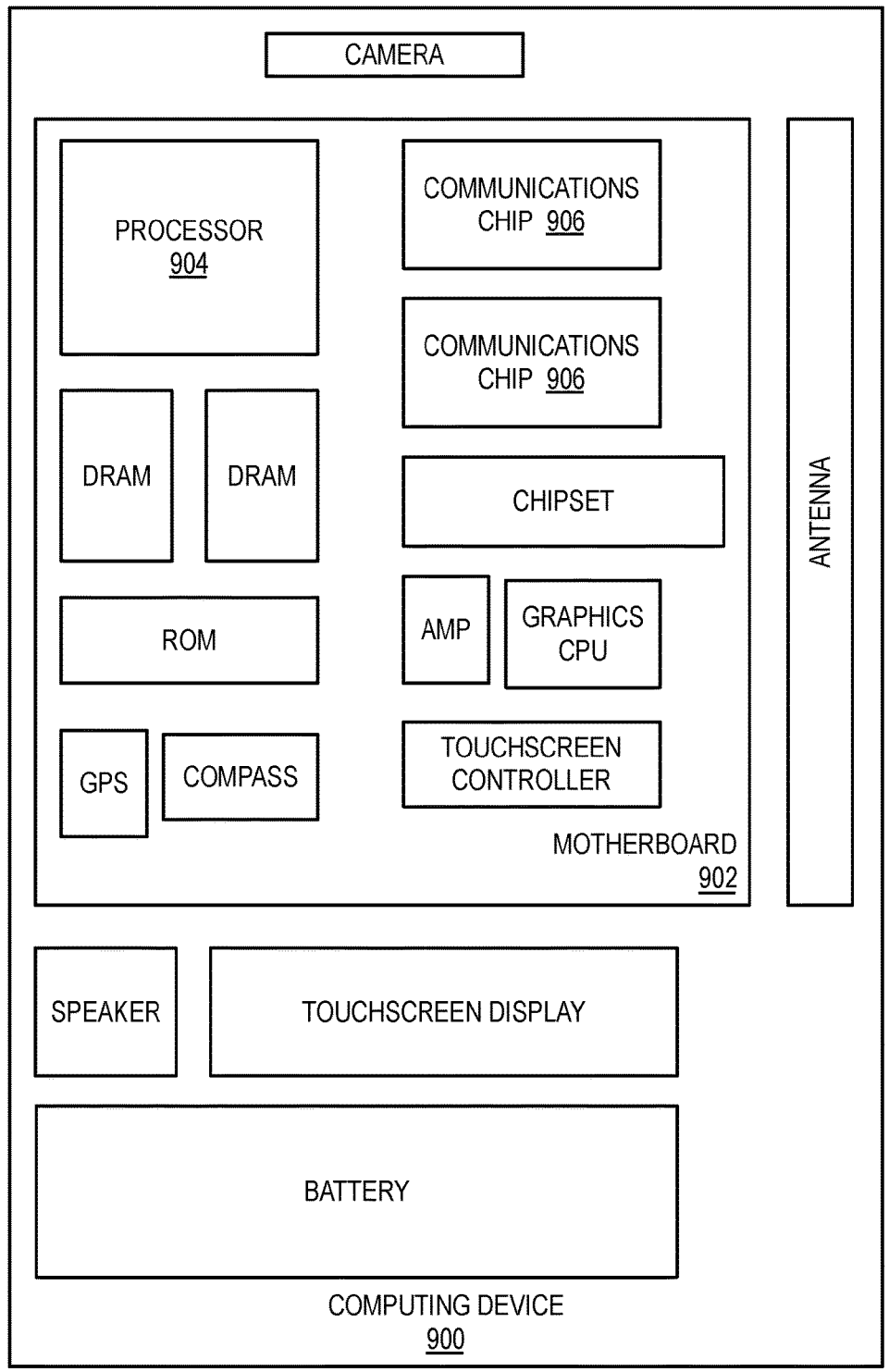
FIG. 9 is a functional block diagram of an electronic computing device, in accordance with an embodiment of the present invention.

FIG. 9 is a functional block diagram of a computing device 900, arranged in accordance with at least some implementations of the present disclosure. Computing device 900 may be found inside platform 805 or server machine 806, for example. Device 900 further includes a motherboard 902 hosting a number of components, such as, but not limited to, a processor 904 (e.g., an applications processor), which may further incorporate at least one III-N HFET including raised crystalline contact material, in accordance with embodiments of the present invention. Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a transistor comprises a non-silicon device material disposed over a substrate, a gate stack disposed on a top surface of the device material and over a channel region of the device material, an amorphous material disposed over the substrate and adjacent to, and covering a portion of, a sidewall of the device material. The transistor further comprises a raised doped crystalline material disposed on the top surface of the device material, and wrapping around the sidewall of the device material, and contact metallization coupled to the raised doped crystalline material.

In furtherance of the one or more first embodiments, the raised doped crystalline material includes a single crystal extending between the top surface and sidewall of the device material.

In furtherance of the one or more first embodiments, the raised doped crystalline material has a dislocation density no more than $10^{12}$ cm$^{-2}$.

In furtherance of the one or more first embodiments, the device layer comprises a damaged region, the amorphous material covers at least some of the damaged region.

In furtherance of the one or more first embodiments, the non-silicon device material comprises a III-N heterojunction that forms a 2DEG within the device material. The raised doped crystalline material comprises an n+ doped III-N crystal disposed on c-plane of the device material. The n+ doped III-N crystal wraps around the sidewall of the device material, extending over the III-N heterojunction and electrically coupling with the 2DEG.

In furtherance of the embodiment immediately above, the III-N heterojunction comprises an AlN polarization layer disposed on GaN. The raised doped crystalline material is disposed over a top surface of the AlN polarization layer. At least a portion of the raised doped crystalline material wrapping around the sidewall is disposed directly on GaN.

In furtherance of the first embodiments above, the amorphous material is disposed within a recess in the device material, and a top surface of the amorphous material is recessed below the 2DEG In furtherance of the embodiment immediately above, the raised doped crystalline material is in direct contact with the amorphous material.

In furtherance of the first embodiments above, the device material comprises a raised III-N crystalline body extending laterally over a portion of the amorphous material.

In furtherance of the embodiment immediately above, the raised doped crystalline material is in direct contact with the amorphous material.

In furtherance of the embodiment immediately above, the substrate is silicon, the amorphous material and the device material are disposed over a (100) surface of the substrate, the gate stack comprises a gate electrode disposed on a gate dielectric, and the gate stack is insulated from the raised doped crystalline material by a dielectric spacer.

In one or more second embodiments, a semiconductor device comprises a crystalline substrate, an amorphous material disposed over the substrate, and an elevated structure having non-cubic crystallinity disposed in one or more first trench in the amorphous material and laterally extending over a portion of the amorphous material. One or more device layer having the same crystallinity as the elevated structure is disposed over a top surface of the elevated structure, but absent from at least a portion of a sidewall of the elevated structure. A raised doped source/drain material having the same crystallinity as the elevated structure disposed over a top surface of the one or more device layer, and further wrapping around the elevated structure to contact the portion of a sidewall not covered by the device layer. Contact metallization is coupled to the raised source/drain material.

In furtherance of the one or more second embodiments, the raised doped source/drain material comprises a single crystal extending between the sidewall and the contact metallization.

In furtherance of the one or more second embodiments, a number of crystal defects at the sidewall is greater than the number of crystal defects at the top surface of the one or more device layer.

In furtherance of the embodiment immediately above, the dislocation density of the raised doped source/drain material is not more than one order of magnitude greater than that of the elevated structure.

In furtherance of the embodiment immediately above, the raised doped source/drain material has a dislocation density no more than $10^{12}$ cm$^{-2}$.

In one or more third embodiments, a method of forming semiconductor device comprises epitaxially growing a device layer on a non-silicon crystalline material disposed over a substrate, depositing an amorphous material adjacent to a sidewall of the non-silicon crystalline material, nucleating an epitaxial doped crystalline source/drain material on the device layer, and epitaxially growing the doped crystalline source/drain material laterally around a sidewall of the device layer and the non-silicon crystalline material.

In furtherance of the embodiment immediately above, the method further comprises etching a recess into the non-silicon crystalline material to form the sidewall in the non-silicon crystalline material, depositing the amorphous material in the recess.

In furtherance of the third embodiments, the method further comprises depositing the amorphous material over the substrate, forming one or more trench in the amorphous material, epitaxially growing a raised non-cubic crystalline structure over the substrate, within the one or more trench, and laterally over the amorphous material, and epitaxially growing the one or more device layer over the raised structure.

In furtherance of the embodiment immediately above, the substrate surface comprises (100) silicon offcut by less than 10°, and epitaxially growing the raised structure further comprises laterally growing III-N material over the trench material at a rate that favors wurtzite crystal facets non-parallel and non-normal to the c-plane. Epitaxially growing the device layer comprises growing a III-N polarization layer over the top surface of the raised III-N material parallel to the c-plane.

In furtherance of the embodiment immediately above, epitaxially growing the raised structure further comprises laterally growing GaN, growing the one or more device layer further comprises growing a III-N polarization layer over the GaN, and epitaxially growing the doped crystalline source/drain material comprises laterally growing n+ doped InGaN having a dislocation density no more than one order or magnitude greater than the one or more device layer.

In furtherance of the third embodiments, the method further comprises depositing a gate stack over the device layer, and forming source/drain contact metallization to a first and a second region of doped crystalline source/drain material disposed on opposite sides of the gate stack.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed:
1. A transistor, comprising:
a non-silicon device material disposed over a crystalline substrate;
a gate stack disposed on a top surface of the device material and over a channel region of the device material;
an amorphous material disposed over the substrate and adjacent to, and covering a portion of, a sidewall of the device material;
a raised doped crystalline material disposed on the top surface of the device material, and wrapping around the sidewall of the device material; and
contact metallization coupled to the raised doped crystalline material.

2. The transistor of claim 1, wherein the raised doped crystalline material includes a single crystal extending between the top surface and sidewall of the device material.

3. The transistor of claim 1, wherein the raised doped crystalline material has a dislocation density no more than $10^{12}$ cm$^{-2}$.

4. The transistor of claim 1, wherein the device material comprises a surface damaged region; and
the amorphous material covers at least some of the surface damaged region.

5. The transistor of claim 1, wherein:
the non-silicon device material comprises an III-N heterojunction that forms a 2DEG within the device material;
the raised doped crystalline material comprises an n+ doped III-N crystal disposed on the c-plane of the device material; and
the n+ doped III-N crystal wraps around the sidewall of the device material, extending over the III-N heterojunction and electrically coupling with the 2DEG.

6. The transistor of claim 5, wherein:
the III-N heterojunction comprises an AlN polarization layer disposed on GaN;
the raised doped crystalline material is disposed over a top surface of the AlN polarization layer; and
at least a portion of the raised doped crystalline material wrapping around the sidewall is disposed directly on GaN.

7. The transistor of claim 5, wherein:
the amorphous material is disposed within a recess in the device material; and
a top surface of the amorphous material is recessed below the 2DEG.

8. The transistor of claim 7, wherein the raised doped crystalline material is in direct contact with the amorphous material.

9. The transistor of claim 5, wherein the device material comprises a raised III-N crystalline body extending laterally over a portion of the amorphous material.

10. The transistor of claim 9, wherein the raised doped crystalline material is in direct contact with the amorphous material.

11. The transistor of claim 10, wherein:
the substrate is silicon;
the amorphous material and the device material are disposed over a (100) surface of the substrate;
the gate stack comprises a gate electrode disposed on a gate dielectric; and
the gate stack is insulated from the raised doped crystalline material by a dielectric spacer.

12. A semiconductor device, comprising:
a crystalline substrate;
an amorphous material disposed over the substrate;
an elevated structure having crystallinity different than the substrate and disposed in one or more first trench in the amorphous material and laterally extending over a portion of the amorphous material;

one or more device layers having the same crystallinity as the elevated structure disposed over a top surface of the elevated structure, but absent from at least a portion of a sidewall of the elevated structure;

a raised doped source/drain material having the same crystallinity as the elevated structure disposed over a top surface of the one or more device layers, and further wrapping around the elevated structure to contact the portion of a sidewall not covered by the one or more device layers; and contact metallization coupled to the raised source/drain material.

13. The semiconductor device of claim 12, wherein:
the raised doped source/drain material comprises a single crystal extending between the sidewall and the contact metallization.

14. The semiconductor device of claim 12, wherein a number of crystal defects at the sidewall is greater than the number of crystal defects at the top surface of the one or more device layers.

15. The semiconductor device of claim 14, wherein a dislocation density of the raised doped source/drain material is not more than one order of magnitude greater than that of the elevated structure.

16. The semiconductor device of claim 15, wherein the raised doped source/drain material has a dislocation density no more than $10^{12}$ cm$^{-2}$.

* * * * *